US011163027B2

(12) United States Patent
Miyazaki et al.

(10) Patent No.: US 11,163,027 B2
(45) Date of Patent: Nov. 2, 2021

(54) MAGNETIC RESONANCE IMAGING APPARATUS AND MAGNETIC RESONANCE IMAGING METHOD

(71) Applicants: CANON MEDICAL SYSTEMS CORPORATION, Otawara (JP); THE REGENTS OF THE UNIVERSITY OF CALIFORNIA, Oakland, CA (US)

(72) Inventors: Mitsue Miyazaki, Vernon Hills, IL (US); Cheng Ouyang, La Jolla, CA (US); Christine Chung, La Jolla, CA (US)

(73) Assignees: CANON MEDICAL SYSTEMS CORPORATION, Otawara (JP); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 165 days.

(21) Appl. No.: 16/432,644

(22) Filed: Jun. 5, 2019

(65) Prior Publication Data
US 2020/0386838 A1    Dec. 10, 2020

(51) Int. Cl.
*G01R 33/48*          (2006.01)
*G01R 33/483*         (2006.01)
(Continued)

(52) U.S. Cl.
CPC ..... *G01R 33/4828* (2013.01); *G01R 33/4833* (2013.01); *G01R 33/5608* (2013.01); *G01R 33/5617* (2013.01)

(58) Field of Classification Search
CPC ............ G01R 33/4828; G01R 33/4833; G01R 33/5608; G01R 33/5617; G01R 33/546; G01R 33/5607
See application file for complete search history.

(56) References Cited

U.S. PATENT DOCUMENTS

2013/0249552 A1*  9/2013  Imamura ............. G01R 33/583
                                                 324/309
2015/0348289 A1* 12/2015  Ida ........................ A61B 6/032
                                                 382/131
(Continued)

OTHER PUBLICATIONS

Scott B. Reeder, et al. "Iterative Decomposition of Water and Fat With Echo Asymmetry and Least-Squares Estimation (IDEAL)—Application With Fast Spin-Echo Imaging", Magnetic Resonance in Medicine 54, 2005, pp. 636-644.
(Continued)

*Primary Examiner* — Farhana A Hoque
(74) *Attorney, Agent, or Firm* — Oblon, McClelland, Maier & Neustadt, L.L.P.

(57) ABSTRACT

A magnetic resonance imaging apparatus according to an embodiment includes sequence controlling circuitry and processing circuitry. The sequence controlling circuitry performs a first acquisition and a second acquisition, the first acquisition including executing a preparation module corresponding to a first Echo Time (TE) value and subsequently performing an acquisition sequence, the second acquisition including executing the preparation module corresponding to a second TE value different from the first TE value and subsequently performing the acquisition sequence, the acquisition sequence being a pulse sequence including applying an RF excitation pulse in presence of a gradient magnetic field, and subsequently applying an RF re-focusing pulse in presence of another gradient magnetic field having an opposite polarity to that of the gradient magnetic field. The processing circuitry extracts at least one of a signal related to a first fat and a signal related to a second fat.

20 Claims, 9 Drawing Sheets

(51) Int. Cl.
*G01R 33/56* (2006.01)
*G01R 33/561* (2006.01)

(56) References Cited

U.S. PATENT DOCUMENTS

2016/0231408 A1* 8/2016 Kannengiesser .. G01R 33/4828
2017/0307715 A1* 10/2017 Eggers ................. G01R 33/563

OTHER PUBLICATIONS

Huanzhou Yu, et al. "Multiecho Water-Fat Separation and Simultaneous R2 Estimation With Multifrequency Fat Spectrum Modeling", Magnetic Resonance in Medicine 60, 2008, pp. 1122-1134.
Kaipin Xu, et al. "Reliable Quantification of Marrow Fat Content and Unsaturation Level Using in Vivo MR Spectroscopy", Mar. 2018, (DOI 10.1002/mm.26828).
M. Miyazaki, et al. "A Polarity Altered Spectral and Spatial Selective Acquisition Technique", ISMRM, 1995, p. 657.
Gavin Hamilton, et al. "MR Properties of Brown and White Adipose Tissues", Journal of Magnetic Resonance Imaging 34, 2011, pp. 468-473.

* cited by examiner

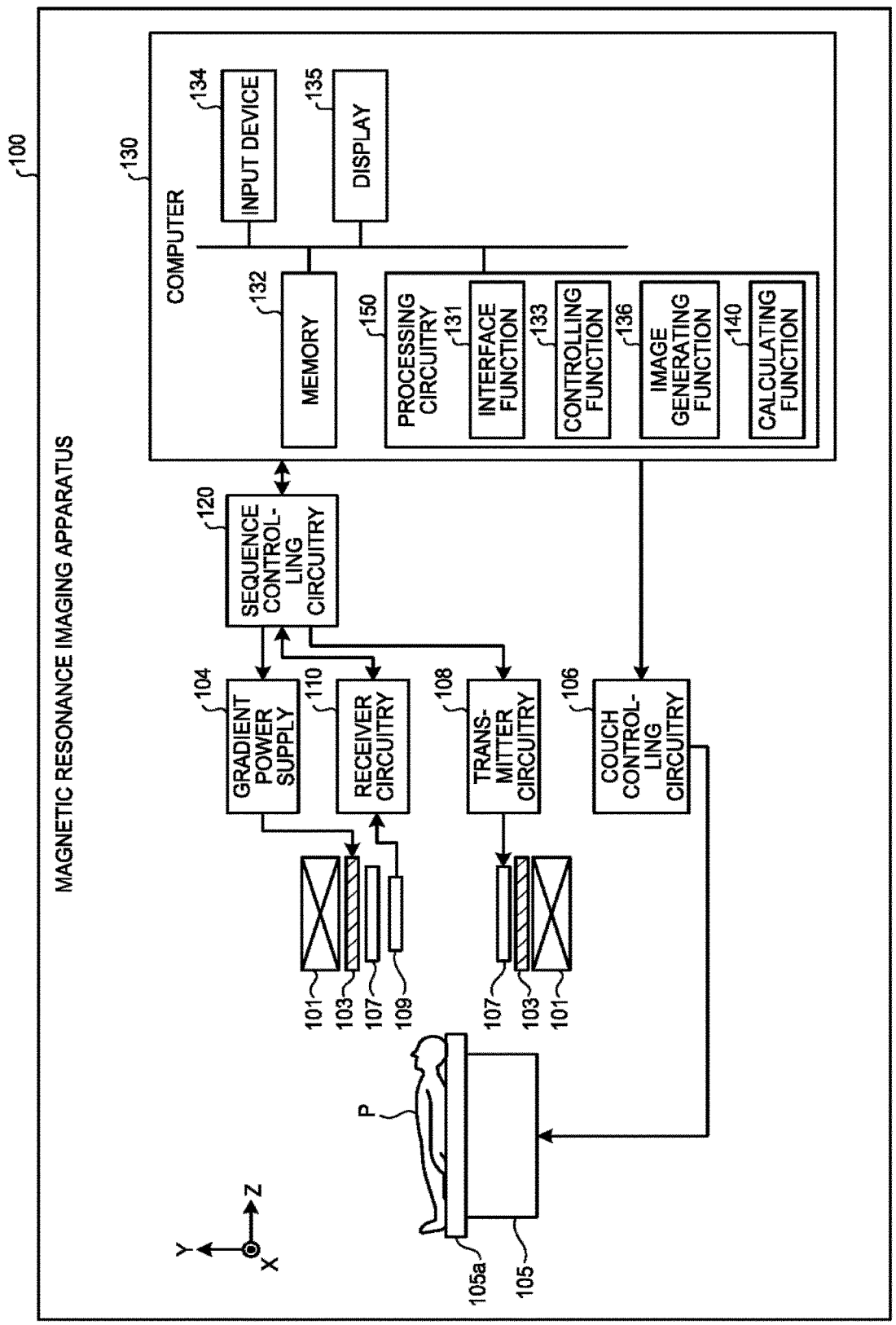

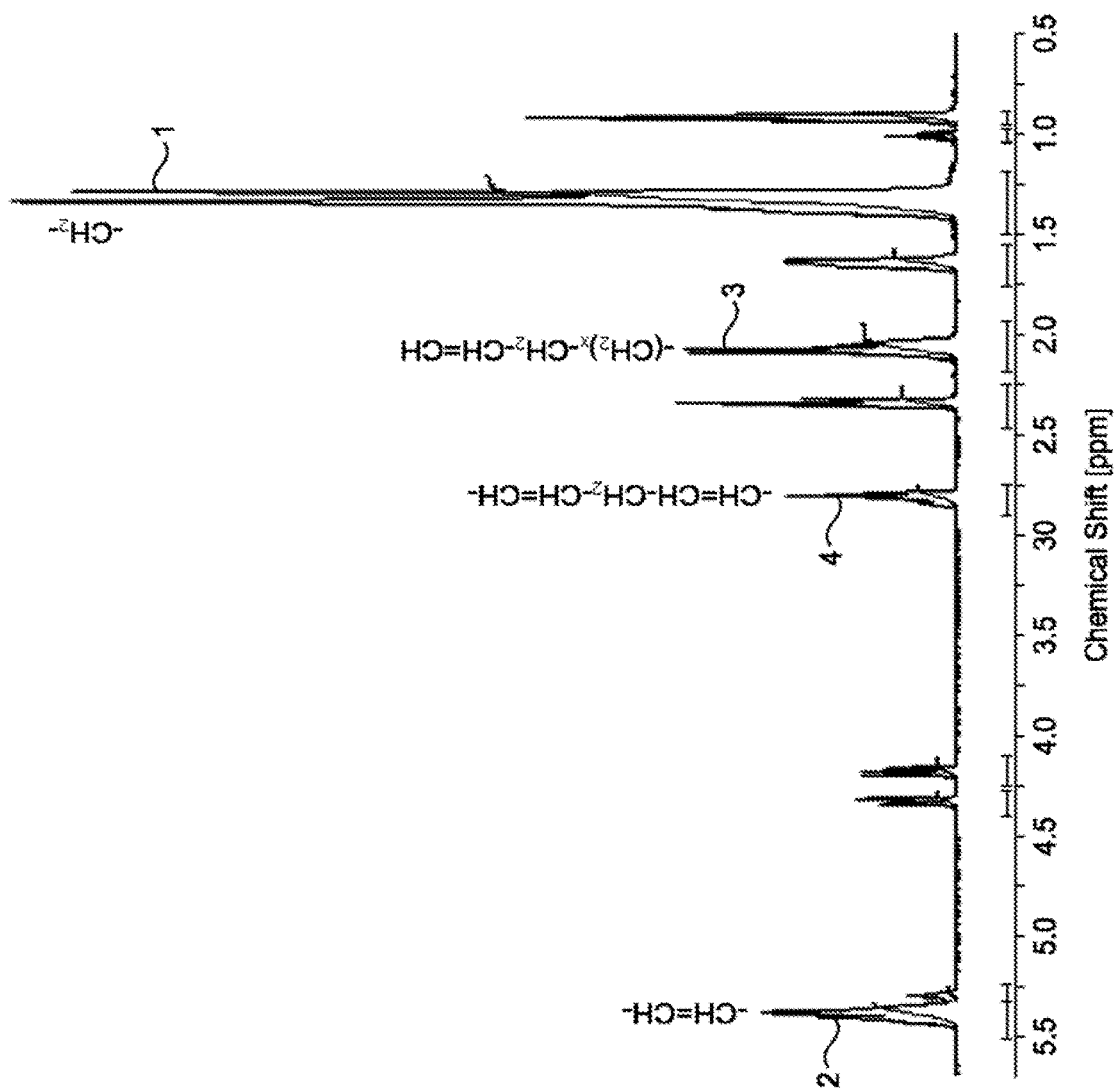

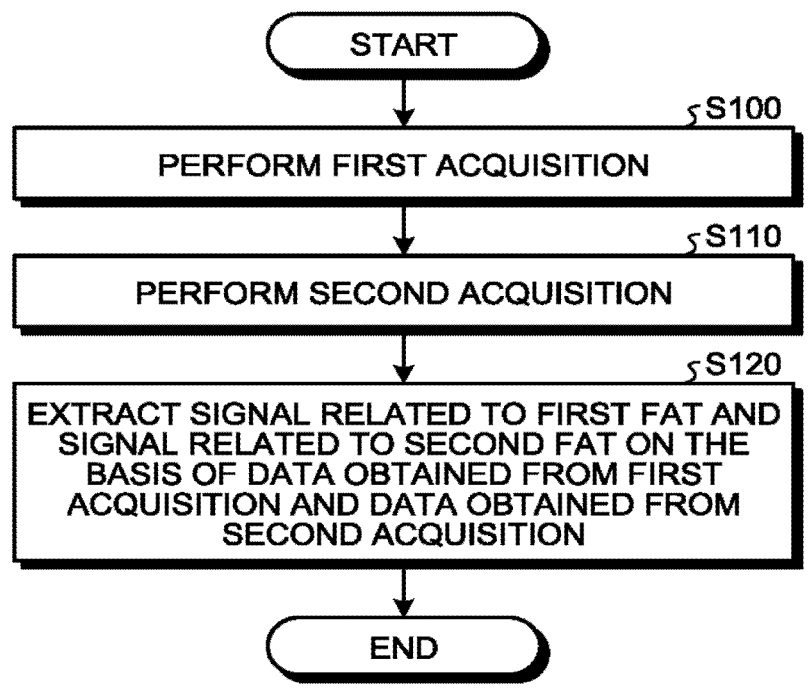

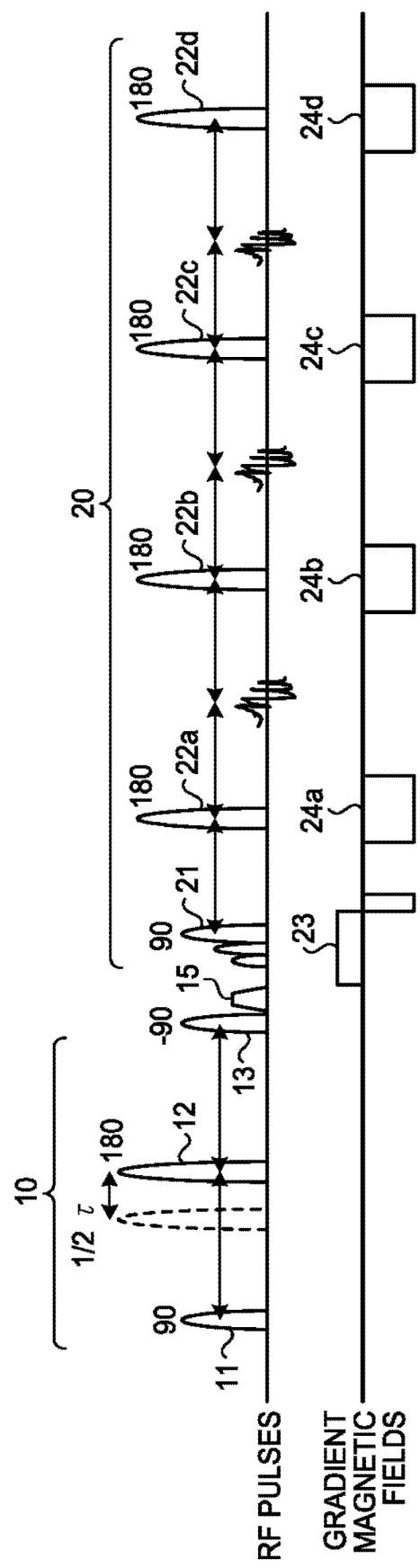

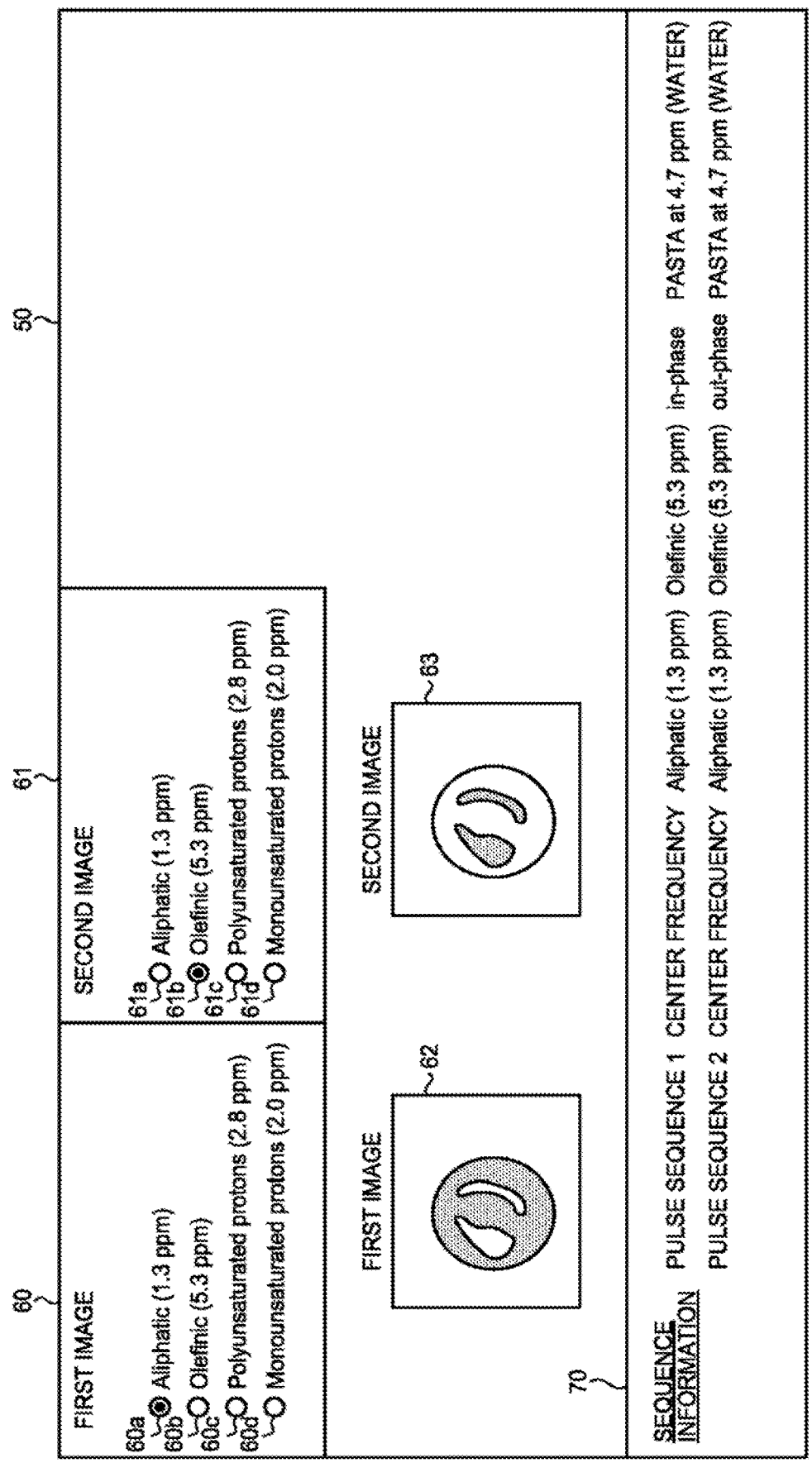

MAGNETIC RESONANCE IMAGING APPARATUS AND MAGNETIC RESONANCE IMAGING METHOD

CROSS-REFERENCE TO RELATED APPLICATIONS

Embodiments described herein relate generally to a magnetic resonance imaging apparatus and a magnetic resonance imaging method.

FIELD

Background

Separating a signal of water and a signal of fat from each other is an important issue in magnetic resonance imaging. In recent years, some focus is placed on fats such as olefinic fat that is other than saturated fats. For example, people have an interest in the amount of olefinic fat in the liver, bones, and various fat tissues.

To quantify signals of saturated fat and unsaturated fat, Point Resolved Spectroscopy (PRESS) may be used, for example, by which an image taking process is performed by implementing single-voxel Magnetic Resonance Spectroscopy (MRS). However, it is desirable to quantify fats by using a two-dimensional (2D) or three-dimensional (3D) image, instead of the single-voxel image taking process.

Further, for example, a known method for extracting a signal of fat uses a method called Iterative Decomposition of water and fat with Echo Asymmetry and Least-squares estimation (IDEAL), or the like. According to this method, however, an image taking process is usually performed on the assumption that the number of types of fat to be rendered is one.

BRIEF DESCRIPTION OF THE DRAWINGS

FIG. 1 is a diagram illustrating a magnetic resonance imaging apparatus according to an embodiment;

FIG. 2 is a chart for explaining a background of the embodiment;

FIG. 3 is a flowchart for explaining a process performed by a magnetic resonance imaging apparatus according to embodiments;

FIGS. 4, 5A, and 5B illustrate an example of a pulse sequence executed by a magnetic resonance imaging apparatus according to an embodiment;

FIG. 9 illustrates an example of a Graphical User Interface (GUI) included in a magnetic resonance imaging apparatus according to an embodiment.

DETAILED DESCRIPTION

First Embodiment

Figure 5A:
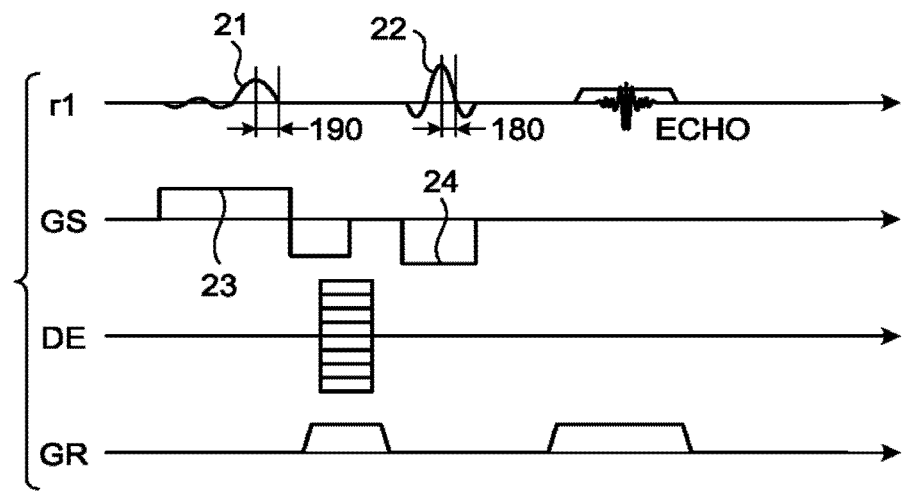

A magnetic resonance imaging apparatus according to an embodiment includes sequence controlling circuitry and processing circuitry. The sequence controlling circuitry performs a first acquisition and a second acquisition, the first acquisition including executing a preparation module corresponding to a first Echo Time (TE) value and subsequently performing an acquisition sequence, the second acquisition including executing the preparation module corresponding to a second TE value different from the first TE value and subsequently performing the acquisition sequence, the acquisition sequence being a pulse sequence including applying an RF excitation pulse in presence of a gradient magnetic field, and subsequently applying an RF re-focusing pulse in presence of another gradient magnetic field having an opposite polarity to that of the gradient magnetic field. The processing circuitry extracts at least one of a signal related to a first fat and a signal related to a second fat, on a basis of data obtained from the first acquisition and data obtained from the second acquisition.

FIG. 1 is a block diagram illustrating a magnetic resonance imaging apparatus 100 according to an embodiment. As illustrated in FIG. 1, the magnetic resonance imaging apparatus 100 includes a static magnetic field magnet 101, a static magnetic field power supply (not illustrated), a gradient coil 103, a gradient power supply 104, a couch 105, couch controlling circuitry 106, a transmitter coil 107, transmitter circuitry 108, a receiver coil 109, receiver circuitry 110, sequence controlling circuitry 120 (a sequence controlling unit), and a computer 130 (which may also be referred to as an "image processing apparatus"). The magnetic resonance imaging apparatus 100 does not include an examined subject (hereinafter "patient") P (e.g., a human body). Further, the configuration illustrated in FIG. 1 is merely an example. For instance, one or more of the constituent elements of the sequence controlling circuitry 120 and the computer 130 may be integrated together or separated from the other elements, as appropriate.

The static magnetic field magnet 101 is a magnet formed to have a hollow and substantially circular cylindrical shape and configured to generate a static magnetic field in the space on the inside thereof. For example, the static magnetic field magnet 101 may be a superconductive magnet or the like and is configured to cause magnetic excitation by receiving a supply of an electric current from the static magnetic field power supply. The static magnetic field power supply is configured to supply the electric current to the static magnetic field magnet 101. Alternatively, the static magnetic field magnet 101 may be a permanent magnet. In that situation, the magnetic resonance imaging apparatus 100 does not necessarily have to include the static magnetic field power supply. Further, the static magnetic field power supply may be provided separately from the magnetic resonance imaging apparatus 100.

The gradient coil 103 is a coil formed to have a hollow and substantially circular cylindrical shape and is disposed on the inside of the static magnetic field magnet 101. The gradient coil 103 is structured by combining together three coils corresponding to X-, Y-, and Z-axes that are orthogonal to one another. By individually receiving a supply of an electric current from the gradient power supply 104, these three coils are configured to generate gradient magnetic fields of which the magnetic field intensities change along the X-, Y-, and Z-axes respectively. The gradient magnetic fields generated along the X-, Y-, and Z-axes by the gradient coil 103 are, for example, a slice gradient magnetic field Gs, a phase-encoding gradient magnetic field Ge, and a read-out gradient magnetic field Gr. The gradient power supply 104 is configured to supply the electric currents to the gradient coil 103.

The couch 105 includes a couchtop 105a on which the patient P is placed. Under control of the couch controlling circuitry 106, the couchtop 105a is inserted to the inside of a hollow space (an image taking opening) of the gradient coil 103, while the patient P is placed thereon. Usually, the couch 105 is installed in such a manner that the longitudinal direction thereof extends parallel to the central axis of the static magnetic field magnet 101. Under control of the computer 130, the couch controlling circuitry 106 is configured to move the couchtop 105a in longitudinal directions and up-and-down directions by driving the couch 105.

The transmitter coil 107 is disposed on the inside of the gradient coil 103 and is configured to generate a radio frequency magnetic field by receiving a supply of a Radio Frequency (RF) pulse from the transmitter circuitry 108. The transmitter circuitry 108 is configured to supply the transmitter coil 107 with the RF pulse corresponding to a Larmor frequency determined by the type of the targeted atom and intensities of magnetic fields.

The receiver coil 109 is disposed on the inside of the gradient coil 103 and is configured to receive magnetic resonance signals (which hereinafter may be referred to as "MR signals" as necessary) emitted from the patient P due to an influence of the radio frequency magnetic field. When having received the magnetic resonance signals, the receiver coil 109 outputs the received magnetic resonance signals to the receiver circuitry 110.

The transmitter coil 107 and the receiver coil 109 described above are merely examples. One or more coils may be configured by selecting one or combining two or more from among the following: a coil having only a transmitting function; a coil having only a receiving function; and a coil having transmitting and receiving functions.

The receiver circuitry 110 is configured to detect the magnetic resonance signals output from the receiver coil 109 and to generate magnetic resonance data on the basis of the detected magnetic resonance signals. More specifically, the receiver circuitry 110 generates the magnetic resonance data by performing a digital conversion on the magnetic resonance signals output from the receiver coil 109. Further, the receiver circuitry 110 is configured to transmit the generated magnetic resonance data to the sequence controlling circuitry 120. The receiver circuitry 110 may be provided on the side of a gantry device where the static magnetic field magnet 101, the gradient coil 103, and the like are provided.

The sequence controlling circuitry 120 is configured to perform an image taking process on the patient P by driving the gradient power supply 104, the transmitter circuitry 108, and the receiver circuitry 110 on the basis of sequence information transmitted thereto from the computer 130. In this situation, the sequence information is information defining a procedure for performing the image taking process. The sequence information defines: the intensity of the electric current to be supplied from the gradient power supply 104 to the gradient coil 103 and the timing with which the electric current is to be supplied; the intensity of the RF pulse to be supplied from the transmitter circuitry 108 to the transmitter coil 107 and the timing with which the RF pulse is to be applied; the timing with which the magnetic resonance signals are to be detected by the receiver circuitry 110, and the like. For example, the sequence controlling circuitry 120 may be an integrated circuit such as an Application Specific Integrated Circuit (ASIC), a Field Programmable Gate Array (FPGA), or the like or an electronic circuit such as a Central Processing Unit (CPU), a Micro Processing Unit (MPU), or the like. Details of a pulse sequence executed by the sequence controlling circuitry 120 will be explained later.

Further, when having received the magnetic resonance data from the receiver circuitry 110 as a result of performing the image taking process on the patient P by driving the gradient power supply 104, the transmitter circuitry 108, and the receiver circuitry 110, the sequence controlling circuitry 120 is configured to transfer the received magnetic resonance data to the computer 130.

The computer 130 is configured to exercise overall control of the magnetic resonance imaging apparatus 100 and to generate images, and the like. The computer 130 includes a memory 132, an input device 134, a display 135, and processing circuitry 150. The processing circuitry 150 includes an interface function 131, a controlling function 133, an image generating function 136, and a calculating function 140.

In a first embodiment, processing functions performed by the interface function 131, the controlling function 133, the image generating function 136, and the calculating function 140 are stored in the memory 132 in the form of computer-executable programs. The processing circuitry 150 is a processor configured to realize the functions corresponding to the programs by reading and executing the programs from the memory 132. In other words, the processing circuitry 150 that has read the programs has the functions illustrated within the processing circuitry 150 in FIG. 1. FIG. 1 illustrates an example in which the single processing circuit (i.e., the processing circuitry 150) realizes the processing functions performed by the interface function 131, the controlling function 133, the image generating function 136, and the calculating function 140; however, another arrangement is also acceptable in which the processing circuitry 150 is structured by combining together a plurality of independent processors, so that the functions are realized as a result of the processors executing the programs. In other words, it is acceptable to configure each of the functions described above as a program, so that the single processing circuitry (i.e., the processing circuitry 150) executes the programs. Alternatively, one or more specific functions each may be installed in a dedicated independent program-executing circuit. The interface function 131, the controlling function 133, the image generating function 136, and the calculating function 140 are examples of a receiving unit, a controlling unit, an image generating unit, and a calculating unit, respectively. The sequence controlling circuitry 120 is an example of a sequence controlling unit. Specific processes performed by the calculating function 140 will be explained later.

The term "processor" used in the above explanation denotes, for example, a Central Processing Unit (CPU), a Graphical Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). The one or more processors realize the functions by reading and executing the programs stored in the memory 132.

Further, instead of saving the programs in the memory 132, it is also acceptable to directly incorporate the programs in the circuits of the processors. In that situation, the processors realize the functions thereof by reading and executing the programs incorporated in the circuits thereof. Similarly, the couch controlling circuitry 106, the transmitter circuitry 108, the receiver circuitry 110, and the like are also each configured with an electronic circuit such as the processor defined above.

By employing the interface function 131, the processing circuitry 150 is configured to transmit the sequence information to the sequence controlling circuitry 120 and to receive the magnetic resonance data from the sequence controlling circuitry 120. When having received the magnetic resonance data, the processing circuitry 150 including the interface function 131 is configured to store the received magnetic resonance data into the memory 132.

The magnetic resonance data stored in the memory 132 is arranged into a k-space by the controlling function 133. As a result, the memory 132 stores therein k-space data.

The memory 132 is configured to store therein the magnetic resonance data received by the processing circuitry 150 having the interface function 131; the k-space data arranged into the k-space by the processing circuitry 150 having the controlling function 133; image data generated by the processing circuitry 150 having the image generating function 136; and the like. For example, the memory 132 is configured with a semiconductor memory element such as a Random Access Memory (RAM), a flash memory, or the like, or a hard disk, an optical disk, or the like.

The input device 134 is configured to receive inputs of various types of instructions and information from the operator. The input device 134 is, for example, a pointing device such as a mouse and/or a trackball; a selecting device such as a mode changing switch; and/or an input device such as a keyboard. The display 135 is configured to display, under control of the processing circuitry 150 having the controlling function 133, a Graphical User Interface (GUI) used for receiving inputs of image taking conditions, as well as images generated by the processing circuitry 150 having the image generating function 136, and the like. The display 135 is, for example, a display device configured with a liquid crystal display monitor, or the like.

By employing the controlling function 133, the processing circuitry 150 is configured to control image taking processes, image generating processes, image display processes, and the like, by exercising overall control of the magnetic resonance imaging apparatus 100. For example, the processing circuitry 150 having the controlling function 133 receives an input of an image taking condition (e.g., an image taking parameter or the like) via the GUI and generates sequence information according to the received image taking condition. Further, the processing circuitry 150 having the controlling function 133 transmits the generated sequence information to the sequence controlling circuitry 120.

By employing the image generating function 136, the processing circuitry 150 is configured to generate an image by reading the k-space data from the memory 132 and performing a reconstructing process such as a Fourier transform on the read k-space data.

Next, the background of the magnetic resonance imaging apparatus 100 according to an embodiment will briefly be explained.

Separating signals of water and signals of fat from each other is an important issue in magnetic resonance imaging. In recent years, some focus is placed on fats such as olefinic fat that is other than saturated fats. For example, people have an interest in the amount of olefinic fat in the liver, bones, and various fat tissues.

FIG. 2 is a chart for explaining the background of the embodiment and illustrates an example of an MRS spectrum while the horizontal axis expresses chemical shift values. Aliphatic protons 1 are protons corresponding to the structure $—CH_2—CH_2—$ and have a chemical shift value of approximately 1.3 ppm. The aliphatic protons 1 are protons related to saturated fat and are the most common protons among protons structuring fat signals. Olefinic fat protons 2 are protons corresponding to the structure $—CH=CH—$ and have a chemical shift value of approximately 5.3 ppm. Monounsaturated fat protons 3 are protons corresponding to the structure $—CH=CH—CH_2—(CH_2)_n—$ and have a chemical shift value of approximately 2.0 ppm. Polyunsaturated fat protons 4 are protons corresponding to the structure $—CH=CH—CH_2—CH=CH—$ and have a chemical shift value of approximately 2.8 ppm. The chemical shift value of water is approximately 4.7 ppm.

Generally speaking, when the amounts of $CH—O(C=O)—$, $CH_2—O(C=O)$, and $—O—(C=O)—CH_2$ in triglyceride are assumed to be constant, the content amounts of fat protons vary from large to small in the following order: the aliphatic fat protons 1, the olefinic fat protons 2, the monounsaturated fat protons 3, and the polyunsaturated fat protons 4.

To quantify signals of saturated fat and unsaturated fat, Point Resolved Spectroscopy (PRESS) may be used, for example, by which an image taking process is performed by implementing single-voxel Magnetic Resonance Spectroscopy (MRS). However, it is desirable to quantify fats by using a two-dimensional (2D) or three-dimensional (3D) image, instead of the single-voxel image taking process. Further, when impacts of B0 non-uniformity or susceptibility effects are present, it may be difficult in some situations to realize high resolution with MRS.

Further, a Dixon-type imaging method is also known. According to the Dixon-type imaging method, an image taking process is performed twice by using a spin echo while slightly varying Echo Time (TE) values, for example, so that a signal of fat and a signal of water have the same phase as each other ("being in-phase") and have phases opposite to each other ("being out of phase").

In this situation, for example, when the signal intensity of an in-phase image is expressed as IP, while the signal intensity of water is expressed as W, and the signal intensity of fat is expressed as F, IP=W+F is satisfied. Further, for example, when the signal intensity of an image having an opposite phase is expressed as OP, OP=W−F is satisfied. When these two expressions are taken as simultaneous equations, W=½(IP+OP) and F=½(IP−OP) are satisfied. Accordingly, by simultaneously satisfying the equations with the pieces of data obtained from the image taking process performed twice, it is possible to separately extract the signal of water and the signal of the fat.

It is desirable to perform the two image taking processes as one pulse sequence linked together. Accordingly, the sequence controlling circuitry 120 performs the two image taking processes while maintaining a receiver gain at the same level.

Further, examples of the Dixon-type imaging method include the Iterative Decomposition of water and fat with Echo Asymmetry and Least-squares estimation (IDEAL) method.

However, according to the IDEAL method, olefinic fat is not taken into consideration, for example. Further, the IDEAL method is a method for estimating the shape of a spectrum and is not a method for directly measuring the constituent elements of mutually-different types of fat.

Further, the regular Dixon-type imaging method may not work in some situations, when no signal of water is present in a pixel.

In view of the background described above, the sequence controlling circuitry 120 included in the magnetic resonance imaging apparatus 100 according to an embodiment is configured to extract signals of a plurality of types of fat, by executing a pulse sequence combining a Dixon-type preparation module with, for example, a Polarity Altered Spectral and Spatial Selective Acquisition (PASTA) scheme used for a 2D- or 3D Fast Spin Echo (FSE). This method according to the embodiment does not require a complicated algorithm at the time of the extraction. Further, because a 2D- or 3D-image taking sequence is used, it is possible to obtain a 2D- or 3D-image. Further, depending on the type of the protons of the fat to be imaged, it is possible to freely change the time period $\tau$ in the Dixon scheme. It is therefore possible to stabilize the quality of output images. Further, when FSE is used, because J couplings do not couple with each other, it is expected that high fat signal can be obtained.

In an existing pattern, the sequence controlling circuitry 120 arranges the center frequency to be a frequency corresponding to the chemical shift of water, for example, and in a Dixon-type preparation module, selects such an Echo Time (TE) value that makes the signal of aliphatic fat to have an opposite phase. The sequence controlling circuitry 120 may use this existing pattern or may use another pattern in which the center frequency is arranged to be a frequency corresponding to the signal of aliphatic fat, and in a Dixon-type preparation module, such a TE value that causes a signal of olefinic fat to have an opposite phase is selected.

Examples of fats include brown fats containing water, as well as fats containing no water such as white fats. In this regard, by arranging the center frequency not to be equal to the frequency corresponding to the chemical shift of water, it is possible to widen the range of sequences which the sequence controlling circuitry 120 is able to execute.

With the embodiment, it is also acceptable to combine, as appropriate and when necessary, a water suppressing technique according to a Fluid Attenuated IR (FLAIR) scheme for the purpose of eliminating effects of the signal of water.

The process will be explained, with reference to FIGS. 3, 4, 5A, 5B, 6A, and 6B.

FIG. 3 is a flowchart for explaining a process performed by a magnetic resonance imaging apparatus according to embodiments. Because the flowchart in FIG. 3 is applicable to first, second, and third embodiments, the flowchart will be used throughout these embodiments.

At first, at step S100, the sequence controlling circuitry 120 performs a first acquisition, the first acquisition including executing a preparation module corresponding to a first Echo Time (TE) value and subsequently performing an acquisition sequence, the acquisition sequence being a pulse sequence including applying an RF excitation pulse in presence of a gradient magnetic field, and subsequently applying an RF re-focusing pulse in presence of another gradient magnetic field having an opposite polarity to that of the gradient magnetic field. Subsequently, at step S110, the sequence controlling circuitry 120 performs a second acquisition, the second acquisition including executing the preparation module corresponding to a second TE value different from the first TE value and subsequently performing the acquisition sequence. Further, the sequence control circuitry 120 executes the first acquisition and the second acquisition as a linked one acquisition while maintaining a receiver gain at a same level, that is, maintaining the imaging condition such that each piece of data acquired at each acquisition can be fairly compared.

Figure 5B:
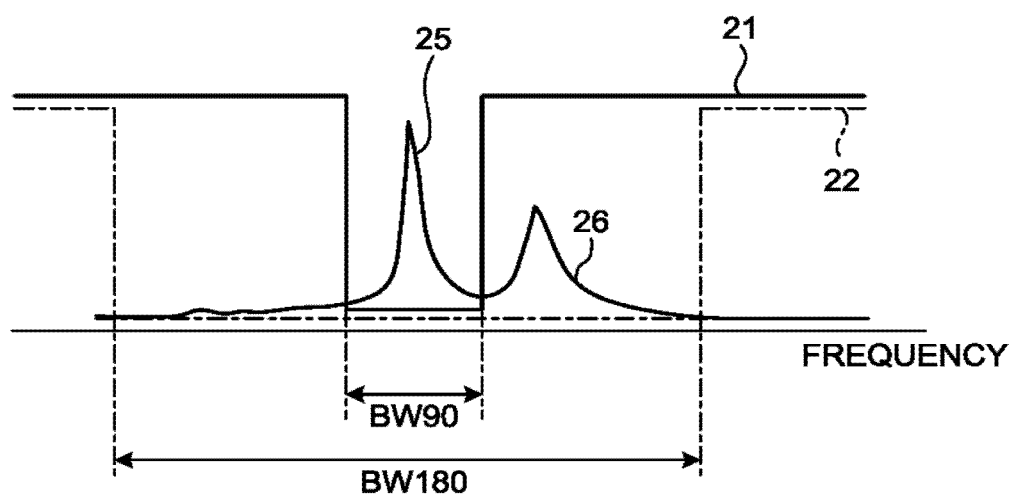

Details of steps S100 and S110 mentioned above will be explained, with reference to FIGS. 4, 5A, and 5B. FIGS. 4, 5A, and 5B illustrate an example of the pulse sequence executed by the magnetic resonance imaging apparatus 100 according to the embodiment.

FIG. 4 illustrates the entirety of a pulse sequence executed by the sequence controlling circuitry 120. In this situation, the pulse sequence executed by the sequence controlling circuitry 120 is roughly made up of: a preparation module 10 configured with a Dixon-type preparation module, for example; and an acquisition sequence 20 that is an acquisition sequence implemented by using a Polarity Altered Spectral and Spatial Selective Acquisition (PASTA) scheme.

The preparation module 10 configured with a Dixon-type preparation module or the like includes, for example, a 90-degree pulse 11, a 180-degree pulse 12, a −90-degree pulse 13, and a spoiler 15.

By using mutually the same acquisition sequence 20 while varying the preparation module 10, the sequence controlling circuitry 120 performs the acquisition twice in total. More specifically, the sequence controlling circuitry 120 performs the acquisition twice in total by using mutually the same acquisition sequence 20, while changing the TE value by the time period $\frac{1}{2}\tau$ every time the application time of the 180-degree pulse 12 in the preparation module 10 is changed. For example, in the first acquisition, the sequence controlling circuitry 120 executes the preparation module 10 by using such a TE value that causes a first signal and a second signal to be in-phase with each other. Further, for example, in the second acquisition, the sequence controlling circuitry 120 executes the preparation module 10 by using such a TE value that causes the first signal and the second signal to be out of phase with each other, for example, that causes the two signals to have phases opposite to each other. As for the first and the second signals, for example, the first signal may be a signal of water, whereas the second signal may be a signal of a fat. In another example, the first signal may be a signal of a first fat, whereas the second signal may be a signal of a second fat.

In other words, at step S100, the sequence controlling circuitry 120 executes the preparation module 10 by which the 180-degree pulse 12 is applied at the time indicated by a solid line in FIG. 4 (i.e., executes the preparation module 10 corresponding to the first TE value), and subsequently, performs the first acquisition by executing the acquisition sequence 20.

After that, at step S110, the sequence controlling circuitry 120 executes the preparation module 10 by which the 180-degree pulse 12 is applied at the time indicated by a dotted line, i.e., at the time shifted from the position of the solid line in FIG. 4 by the time period $\frac{1}{2}\tau$ (i.e., executes the preparation module 10 corresponding to the second TE value different from the first TE value), and subsequently, performs the second acquisition by executing the acquisition sequence 20.

In this situation, for example, when the signal intensity of the first signal is expressed as X, while the signal intensity of the second signal is expressed as Y, a signal intensity A from the first acquisition is expressed as $A=X+Y$. Further, when the signal intensity of the first signal is expressed as X, while the signal intensity of the second signal is expressed as Y, a signal intensity B from the second acquisition is expressed as $B=X-Y$.

Accordingly, when these equations are taken as simultaneous equations, $X=\frac{1}{2}(A+B)$, $Y=\frac{1}{2}(A-B)$ are obtained. In other words, by employing the calculating function 140, the processing circuitry 150 is able to calculate the signal intensity X of the first signal on the basis of a sum of the signal from the first acquisition and the signal from the second acquisition. Also, by employing the calculating function 140, the processing circuitry 150 is able to calculate the signal intensity Y of the second signal, on the basis of the difference between the signal from the first acquisition and the signal from the second acquisition.

Next, the acquisition sequence 20 will be explained. The acquisition sequence 20 is, for example, a 2D- or 3D-Fast Spin Echo (FSE) sequence implemented by using the Polarity Altered Spectral and Spatial Selective Acquisition (PAST) scheme. As illustrated in FIG. 4, the acquisition sequence 20 includes a 90-degree pulse 21 applied in the presence of a first gradient magnetic field 23; and 180-degree pulses 22a, 22b, 22c, and 22d applied in the presence of second gradient magnetic fields 24a, 24b, 24c, and 24d, respectively, each having the opposite polarity to that of the first gradient magnetic field 23. In other words, the sequence controlling circuitry 120 executes, as the acquisition sequence 20, the pulse sequence by which the 90-degree pulse 21 serving as an RF excitation pulse is applied in the presence of the first gradient magnetic field 23, and subsequently, the 180-degree pulses 22a, 22b, 22c, and 22d or the like serving as RF re-focusing pulses are applied respectively in the presence of the gradient magnetic fields 24a, 24b, 24c, and 24d or the like, each being a gradient magnetic field having the opposite polarity to that of the first gradient magnetic field 23.

Next, the acquisition sequence 20 and the PASTA scheme will be explained, with reference to FIGS. 5A and 5B. In the sequence chart illustrated in FIG. 5A, the first section from the top illustrates an RF pulse and an echo; the second section from the top illustrates a gradient magnetic field in the slice direction being applied; the third section from the top illustrates a gradient magnetic field in the phase encoding direction; and the fourth section from the top illustrates a gradient magnetic field in the read-out direction. In this situation, the acquisition sequence 20 is characterized by a set made up of the 90-degree pulse 21 applied in the presence of the first gradient magnetic field 23 and a 180-degree pulse 22 applied in the presence of a second gradient magnetic field 24 having the opposite polarity to that of the first gradient magnetic field 23.

Next, the 90-degree pulse 21 and the 180-degree pulse 22 in the PASTA scheme will be explained, with reference to FIG. 5B. In the present example, to explain a process of extracting a specific signal by using the PASTA scheme, an example will be explained in which a water signal 25 represents a spectrum expressing a signal of water, whereas a fat signal 26 represents a spectrum expressing a signal of a fat.

For example, to selectively extract the signal of water, the sequence controlling circuitry 120 applies, in the acquisition sequence 20, the 90-degree pulse 21 having a band that includes the band of the water signal 25 but does not include the band of the fat signal 26. After that, in the acquisition sequence 20, the sequence controlling circuitry 120 applies the 180-degree pulse 22 having a band that includes the band of the water signal 25 and the band of the fat signal 26.

In this situation, an echo is generated in such a band that is excited by the 90-degree pulse 21 and is also excited by the 180-degree pulse 22. Because the water signal 25 is excited by both the 90-degree pulse 21 and the 180-degree pulse 22, the water signal 25 has signal intensity. On the contrary, because the fat signal 26 is excited by the 180-degree pulse 22, but is not excited by the 90-degree pulse 21, the fat signal 26 does not have high signal intensity.

In this manner, the sequence controlling circuitry 120 selects the signal having the specific frequency. In other words, the sequence controlling circuitry 120 is able to select the signal having the desired frequency, by adjusting the 90-degree pulse 21, the 180-degree pulse 22, the first gradient magnetic field 23, and the second gradient magnetic field 24 to be applied, in accordance with the signal frequency to be selected. As additional information, when the polarity of the second gradient magnetic field 24 is opposite to the polarity of the first gradient magnetic field 23, it is easier to adjust the parameters used for selecting the signal having a desired frequency than when the polarity of the second gradient magnetic field 24 is the same as the polarity of the first gradient magnetic field 23. Accordingly, it is often the case that the polarity of the second gradient magnetic field 24 is arranged to be opposite to the polarity of the first gradient magnetic field 23.

As explained above, the sequence controlling circuitry 120 is able to select the signal having the predetermined frequency, as a result of such a part of the executed pulse sequence that corresponds to the acquisition sequence 20 implemented by using the PASTA scheme. Further, the sequence controlling circuitry 120 is able to separately extract the first signal and the second signal that were captured in the in-phase state and the out-of-phase state, as a result of such a part of the executed pulse sequence that corresponds to the preparation module 10 executed twice while varying the TE value. Consequently, the sequence controlling circuitry 120 is able to extract, for example, two desired types of signals in an environment where three or more types of signals are present, by executing the pulse sequence in which the acquisition sequence 20 implemented by using the PASTA scheme is combined with the preparation module 10 executed multiple times while varying the TE value.

In all of the first, the second, and the third embodiments described below, the sequence controlling circuitry 120 executes the pulse sequence including the acquisition sequence 20 implemented by using the PASTA scheme and the preparation module 10 executed multiple times while varying the TE value; however, details of the procedures vary among the embodiments.

More specifically, in the first embodiment, in the preparation module 10 executed by the sequence controlling circuitry 120, the center frequency is near 1.3 ppm, which is the frequency of the first fat, e.g., the aliphatic protons 1. Further, in the first acquisition, the sequence controlling circuitry 120 executes the preparation module 10 having the first TE value that causes the signal of the first fat and the signal of the second fat (e.g., a signal of the olefinic fat protons 2) to be acquired while being in-phase with each other. Further, in the second acquisition, the sequence controlling circuitry 120 executes the preparation module 10 having the second TE value that causes the signal of the first fat and the signal of the second fat to be acquired while having phases opposite to each other.

Further, the acquisition sequence 20 executed by the sequence controlling circuitry 120 while implementing the PASTA scheme is an acquisition sequence to select the signal having a frequency corresponding to the chemical shift of the first fat mentioned above.

In the second embodiment, in the preparation module 10 executed by the sequence controlling circuitry 120, the center frequency is near 1.3 ppm, which is the frequency of the first fat, e.g., the aliphatic protons 1. Further, in the first acquisition, the sequence controlling circuitry 120 executes the preparation module 10 having the first TE value that causes the signal of the first fat and the signal of the second fat (e.g., a signal of the olefinic fat protons 2) to be acquired while being in-phase with each other. Further, in the second acquisition, the sequence controlling circuitry 120 executes the preparation module 10 having the second TE value that causes the signal of the first fat and the signal of the second fat to be acquired while having phases opposite to each other. In other words, the configurations of the preparation module 10 are the same as those in the first embodiment.

Further, the acquisition sequence 20 executed by the sequence controlling circuitry 120 while implementing the PASTA scheme is an acquisition sequence to select at least one from between a signal having the frequency corresponding to the chemical shift of the second fat and the signal having the frequency corresponding to the chemical shift of water.

In the third embodiment, in the preparation module 10 executed by the sequence controlling circuitry 120, the center frequency is the frequency corresponding to the chemical shift of water. Further, in the first acquisition, the sequence controlling circuitry 120 executes the preparation module 10 having the first TE value that causes the signal of water and a signal of a fat (e.g., a signal of the monounsaturated fat protons 3) to be acquired while being in-phase with each other. Further, in the second acquisition, the sequence controlling circuitry 120 executes the preparation module 10 having the second TE value that causes the signal of water and the signal of the fat to be acquired while having phases opposite to each other.

Further, the acquisition sequence 20 executed by the sequence controlling circuitry 120 while implementing the PASTA scheme is an acquisition sequence to select at least one from between a signal having a frequency corresponding to the chemical shift of a fat (e.g., a signal of the olefinic fat protons 2) different from the fat and a signal having the frequency corresponding to the chemical shift of water.

Figure 6A:
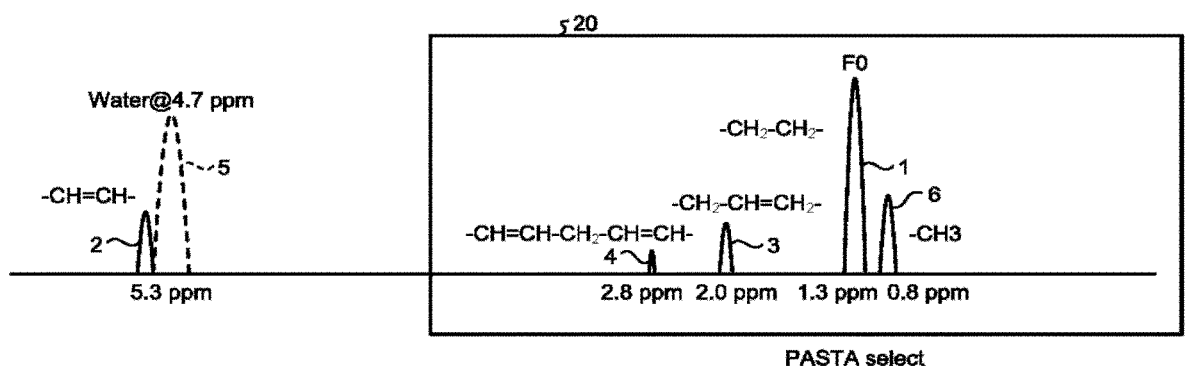
FIGS. 6A and 6B are charts for explaining a process performed by a magnetic resonance imaging apparatus according to a first embodiment.
Figure 6B:
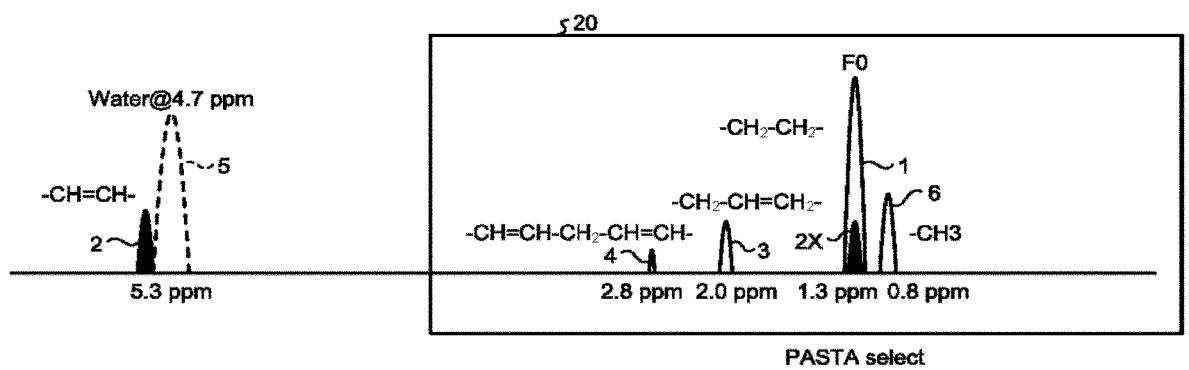

FIGS. 6A and 6B are charts illustrating processes performed when the preparation module 10 and the acquisition sequence 20 are executed according to the first embodiment.

FIG. 6A illustrates examples of spectra of various chemical shift values. FIG. 6A illustrates chemical shift values of the aliphatic protons 1, the olefinic fat protons 2, the monounsaturated fat protons 3, the polyunsaturated fat protons 4, protons in water 5, and protons 6 corresponding to the structure —$CH_3$.

In the first embodiment, a center frequency F0 in the preparation module 10 executed by the sequence controlling circuitry 120 is, as illustrated in FIGS. 6A and 6B, near 1.3 ppm, which is the frequency of the first fat, e.g., the aliphatic protons 1.

Further, as illustrated in FIG. 6A, in the first acquisition, the sequence controlling circuitry 120 executes the preparation module 10 having the first TE value that causes the signal of the first fat and the signal of the second fat (e.g., the signal of the olefinic fat protons 2) to be acquired while being in-phase with each other.

In this situation, in the first acquisition, before the acquisition sequence 20 is executed, the signal of the aliphatic protons 1 serving as the signal of the first fat, and the signal of the olefinic fat protons 2 serving as the signal of the second fat are in-phase with each other.

Further, as illustrated in FIG. 6B, in the second acquisition, the sequence controlling circuitry 120 executes the preparation module 10 having the second TE value that causes the signal of the first fat and the signal of the second fat to be acquired while having phases opposite to each other.

As a result, in the second acquisition, before the acquisition sequence 20 is executed, the signal of the aliphatic protons 1 serving as the signal of the first fat and the signal of the olefinic fat protons 2 serving as the signal of the second fat have phases opposite to each other.

Further, when the signal of the aliphatic protons 1 serving as the signal of the first fat and the signal of the olefinic fat protons 2 are acquired while having the phases opposite to each other, because the signal of the aliphatic protons 1 and the signal of the olefinic fat protons 2 are mixed with each other, the signal intensity is exhibited near the frequency of the aliphatic protons 1, which is the center frequency, as indicated by a spectrum 2X.

In each of the first and the second acquisitions, the sequence controlling circuitry 120 executes, subsequent to the preparation module 10, the acquisition sequence 20 to select the signal having the frequency corresponding to the chemical shift of the first fat, as the acquisition sequence 20 implemented by using the PASTA scheme.

As a result, as illustrated in FIG. 6A, in the first acquisition, during the acquisition sequence 20, the signals of the aliphatic protons 1, the monounsaturated fat protons 3, the polyunsaturated fat protons 4, and the protons 6 corresponding to the structure —$CH_3$ are selected, and conversely, the signals of the olefinic fat protons 2 and the protons in water 5 are suppressed.

Further, as illustrated in FIG. 6B, in the second acquisition also, during the acquisition sequence 20, the signals of the aliphatic protons 1, the monounsaturated fat protons 3, the polyunsaturated fat protons 4, and the protons 6 corresponding to the structure —$CH_3$ are selected, and conversely, the signals of the olefinic fat protons 2 and the protons in water 5 are suppressed. Further, the signal related to the spectrum 2X is also selected.

For the sake of convenience in the explanations below, because the signals of the monounsaturated fat protons 3, the polyunsaturated fat protons 4, and the protons 6 corresponding to the structure —$CH_3$ have low intensity, these signals will not be taken into consideration to simplify the explanations. Instead, the aliphatic protons 1, the olefinic fat protons 2, and the protons in water 5 will be explained.

Next, returning to the description of FIG. 3, at step S120, by employing the calculating function 140, the processing circuitry 150 extracts the signal related to the first fat and the signal related to the second fat, on the basis of the data obtained from the first acquisition and the data obtained from the second acquisition.

In this situation, the signal of the aliphatic protons 1 is, as observed in FIGS. 6A and 6B, a signal belonging to the band selected in the acquisition sequence 20. Accordingly, the signal of the aliphatic protons 1 is selected in both the first and the second acquisitions. Consequently, by employing the calculating function 140, the processing circuitry 150 is able to extract the signal of the aliphatic protons 1, on the basis of a result of adding the data related to the second acquisition to the data related to the first acquisition, for example.

Further, the signal of the protons in water 5 is, as observed in FIGS. 6A and 6B, a signal that does not belong to the band selected in the acquisition sequence 20. Accordingly, the signal of the protons in water 5 is not selected in the first acquisition or the second acquisition. Consequently, the signal of the protons in water 5 is eliminated from both the data related to the first acquisition and the data related to the second acquisition.

Further, the signal of the olefinic fat protons 2 is, as observed in FIGS. 6A and 6B, a signal that does not belong to the band selected in the acquisition sequence 20. Accordingly, the signal of the olefinic fat protons 2 is not directly exhibited in the first acquisition or the second acquisition. However, as observed in FIG. 6B, when the signal of the aliphatic protons 1 serving as the signal of the first fat and the signal of the olefinic fat protons 2 are acquired while having the phases opposite to each other, because the signal of the aliphatic protons 1 and the signal of the olefinic fat protons 2 are mixed with each other, the signal intensity is exhibited near the frequency of the aliphatic protons 1, which is the center frequency, as indicated by the spectrum 2X. Consequently, by employing the calculating function 140, the processing circuitry 150 is able to indirectly obtain data containing information about the signal of the olefinic fat protons 2, by calculating the difference between the data related to the first acquisition and the data related to the second acquisition, for example.

As explained above, the sequence controlling circuitry 120 included in the magnetic resonance imaging apparatus 100 according to the embodiment executes, multiple times, the pulse sequence combining the Dixon-type preparation module 10 with the acquisition sequence 20 implemented by using the PASTA scheme. As a result, it is possible to obtain the signals of the plurality of types of fat.

Second Embodiment

In the second embodiment, the sequence controlling circuitry 120 executes the same preparation module 10 as in the first embodiment; however, the band selected in the acquisition sequence 20 is different from that in the first embodiment.

Figure 7A:
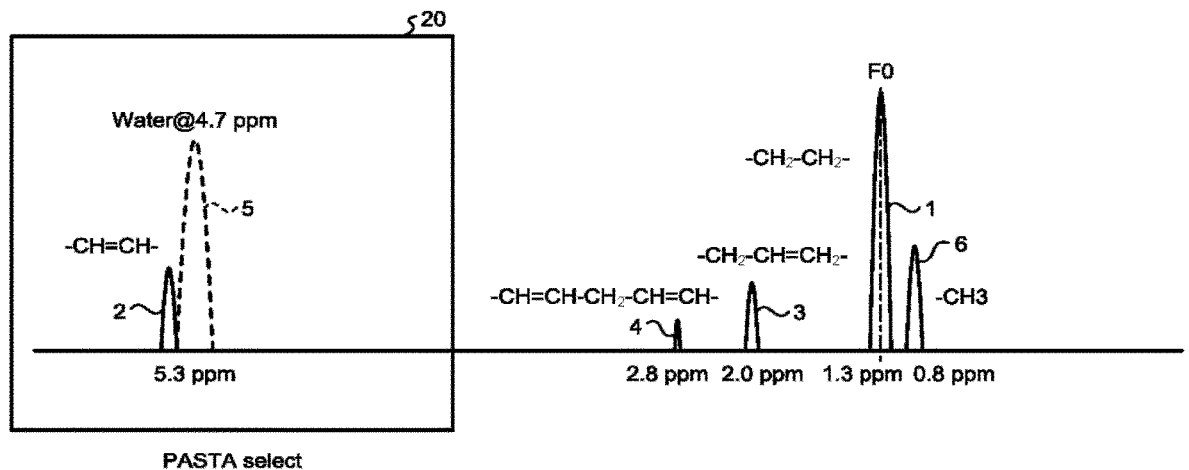
FIGS. 7A and 7B are charts for explaining a process performed by a magnetic resonance imaging apparatus according to a second embodiment.
Figure 7B:
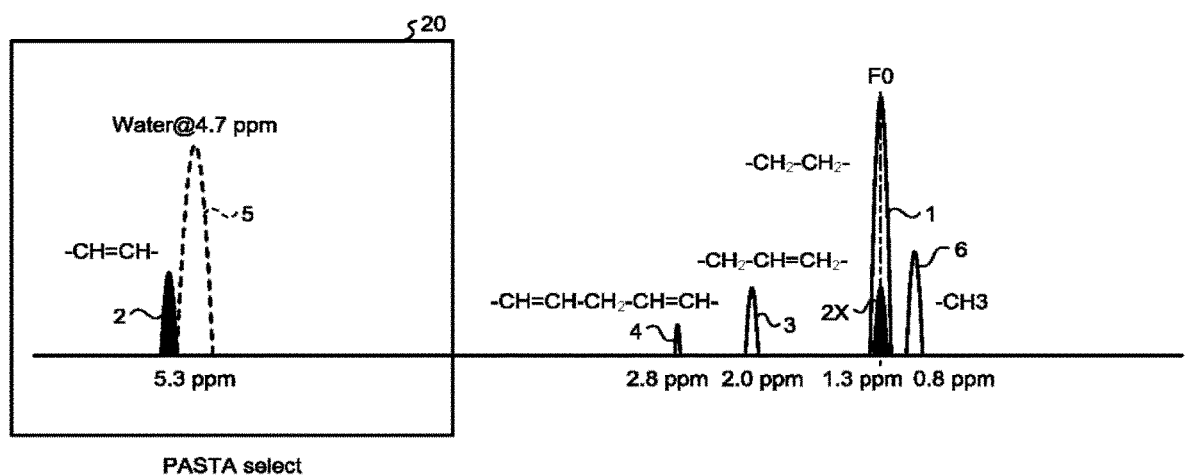

FIGS. 7A and 7B are charts illustrating a process performed when the preparation module 10 and the acquisition sequence 20 are executed according to the second embodiment.

In the second embodiment also, the center frequency F0 in the preparation module 10 executed by the sequence controlling circuitry 120 is near 1.3 ppm, which is the frequency of the first fat, e.g., the aliphatic protons 1, as indicated in FIGS. 7A and 7B. Since the configurations related the preparation module 10 are the same as those in the first embodiment, duplicate explanations thereof will be omitted.

In each of the first and the second acquisitions, the sequence controlling circuitry 120 executes, subsequent to the preparation module 10, the acquisition sequence 20 to select at least one from between a signal having the frequency corresponding to the chemical shift of the second fat, e.g., the olefinic fat protons 2 and a signal having the frequency corresponding to the chemical shift of water, as an acquisition sequence 20 implemented by using the PASTA scheme.

As a result, as illustrated in FIG. 7A, in each of the first and the second acquisitions, the signals of the olefinic fat protons 2 and the protons in water 5 or the like are selected, for example. On the contrary, the signals of the aliphatic protons 1, the monounsaturated fat protons 3, polyunsaturated fat protons 4, and the protons 6 corresponding to the structure —$CH_3$ are suppressed.

Next, returning to the description of FIG. 3, at step S120, by employing the calculating function 140, the processing circuitry 150 extracts the signal related to the protons in water 5 and the signal related to the olefinic fat protons 2 serving as the second fat, on the basis of the data obtained from the first acquisition and the data obtained from the second acquisition.

In this situation, the signal of the olefinic fat protons 2 is, as observed in FIGS. 7A and 7B, a signal that belongs to the band selected in the acquisition sequence 20. Accordingly, the signal of the olefinic fat protons 2 is selected in both the first acquisition and the second acquisition. Consequently, by employing the calculating function 140, the processing circuitry 150 is able to extract the signal of the olefinic fat protons 2, on the basis of the difference between the data related to the first acquisition and the data related to the second acquisition, for example.

Further, the signal of the protons in water 5 is, as observed in FIGS. 7A and 7B, a signal that belongs to the band selected in the acquisition sequence 20. Accordingly, although the phases of the signal are different between the first acquisition and the second acquisition, the signal of the protons in water 5 is selected in both the first and the second acquisitions. Consequently, by employing the calculating function 140, the processing circuitry 150 is able to extract the signal of the protons in water 5 by calculating the change in the phase of the signal of the protons in water 5 between the second acquisition and the first acquisition and further weighting the data related to the first acquisition and the data related to the second acquisition on the basis of the result of the calculation, for example.

Further, for the purpose of suppressing the signal of water, the sequence controlling circuitry 120 may perform the first acquisition and the second acquisition by further combining a Fluid Attenuated IR (FLAIR) method therewith.

Third Embodiment

In the third embodiment, the band selected in the acquisition sequence 20 is the same as that in the second embodiment; however, the frequency corresponding to the chemical shift of water is selected as the center frequency, unlike in the first and the second embodiments.

Figure 8A:
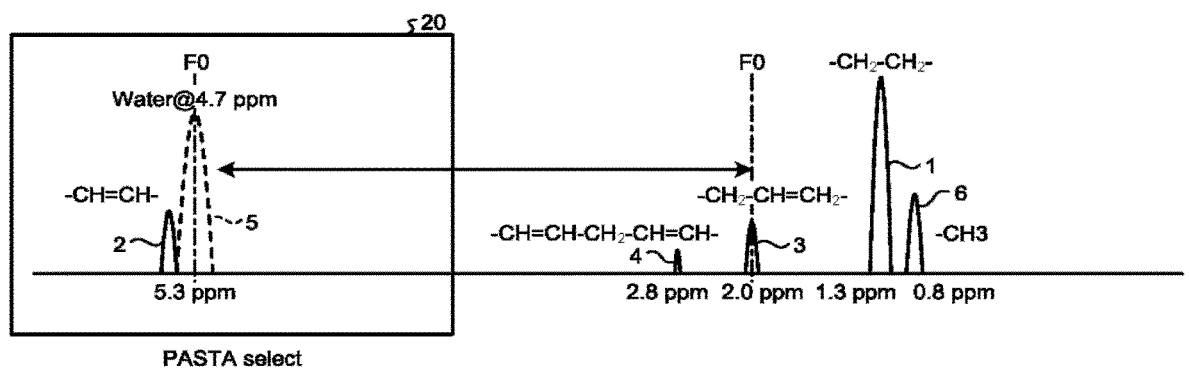
FIGS. 8A and 8B are charts for explaining a process performed by a magnetic resonance imaging apparatus according to a third embodiment.
Figure 8B:
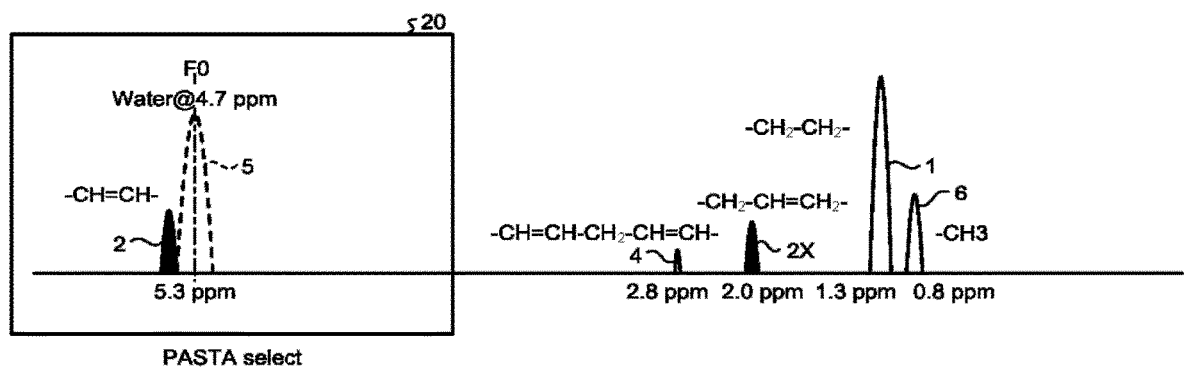

FIGS. 8A and 8B are charts illustrating a process performed when the preparation module 10 and the acquisition sequence 20 are executed according to the third embodiment.

In the third embodiment, the center frequency F0 in the preparation module 10 executed by the sequence controlling circuitry 120 is near 4.7 ppm, which is the frequency corresponding to the chemical shift of water.

Further, as illustrated in FIG. 6A, the sequence controlling circuitry 120 executes, in the first acquisition, the preparation module 10 having the first TE value that causes the signal of the water and the signal of the first fat, e.g., the signal of the monounsaturated fat protons 3 while being in-phase with each other. In this situation, possible embodiments are not limited to this example. For instance, the polyunsaturated fat protons 4 may be selected as the signal of the first fat.

Further, as illustrated in FIG. 6B, the sequence controlling circuitry 120 executes, in the second acquisition, the preparation module 10 having the second TE value that causes the signal of water and the signal of the first fat while having phases opposite to each other.

In each of the first and the second acquisitions, the sequence controlling circuitry 120 executes, subsequent to the preparation module 10, the acquisition sequence 20 to select at least one from between a signal having a frequency corresponding to the chemical shift of the signal of the second fat, e.g., the olefinic fat protons 2 and the signal having the frequency corresponding to the chemical shift of water, as the acquisition sequence 20 implemented by using the PASTA scheme.

As a result, as illustrated in FIGS. 8A and 8B, the signals of the olefinic fat protons 2 and the protons in water 5 are selected.

Further, when the signal of the monounsaturated fat protons 3 serving as the signal of the first fat and the signal of the protons in water 5 are acquired while having the phases opposite to each other, because these signals are mixed with each other, it is expected that the signal intensity is exhibited near the frequency of the protons in water 5, which is the center frequency.

At step S120, by employing the calculating function 140, the processing circuitry 150 extracts the signal related to the first fat, the signal related to water, and the signal related to the second fat, on the basis of the data obtained from the first acquisition and the data obtained from the second acquisition.

For example, by employing the calculating function 140, the processing circuitry 150 is able to obtain data containing information about the signal of monounsaturated fat protons 3, by calculating the difference between the data related to the first acquisition and the data related to the second acquisition, for example.

Further, for the purpose of suppressing the signal of water, the sequence controlling circuitry 120 may perform the first acquisition and the second acquisition by further combining a Fluid Attenuated IR (FLAIR) method therewith.

A GUI According to an Embodiment

With reference to FIG. 9, a Graphical User Interface (GUI) included in the magnetic resonance imaging apparatus 100 according to an embodiment will be explained. FIG. 9 illustrates an example of a Graphical User Interface (GUI) 50 included in the magnetic resonance imaging apparatus according to the embodiment.

Input panels 60 and 61 are panels used by the processing circuitry 150, while employing the controlling function 133, to receive inputs from the user about the targets to be visualized in images. For example, by employing the controlling function 133, the processing circuitry 150 receives a selection about the input of a substance to be rendered in a first image being displayed, via a button 60a, 60b, 60c, or 60d in the input panel 60. Similarly, by employing the controlling function 133, the processing circuitry 150 receives a selection about the input of a substance to be rendered in a second image being displayed, via a button 61a, 61b, 61c, or 61d in the input panel 61.

In this manner, by employing the controlling function 133, the processing circuitry 150 receives, from the user, the inputs about the first fat and the second fat to be rendered, via the input panels 60 and 61.

Subsequently, by employing the controlling function 133, the processing circuitry 150 establishes settings related to the first acquisition, the second acquisition, and the like to be executed by the sequence controlling circuitry 120, on the basis of the received input results. For example, by employing the controlling function 133, the processing circuitry 150 establishes settings, on the basis of the received input results, indicating the center frequency in the pulse sequence to be executed by the sequence controlling circuitry 120 and which signals are to be caused by the executed pulse sequence to have phases opposite to each other, as well as settings related to the frequency band to be selected in the acquisition sequence 20.

Further, by employing the controlling function 133, the processing circuitry 150 displays information about the calculated settings related to the pulse sequences for the user, via a display panel 70.

Subsequently, on the basis of the information about the settings related to the pulse sequences calculated by the processing circuitry 150, the sequence controlling circuitry 120 executes the first acquisition, the second acquisition, and the like, while maintaining the receiver gain at the same level.

On the basis of the data obtained by the pulse sequences executed by the sequence controlling circuitry 120, the processing circuitry 150 performs the signal extracting process described above while employing the calculating function 140, generates an image based on the extracted signals, and causes display panels 62 and 63 or the like to display the generated image, for example.

Other Embodiments

In the embodiments above, the example is explained in which the sequence controlling circuitry 120 executes the pulse sequence twice; however, possible embodiments are not limited to this example. As for the Dixon-type acquisition, the acquisition may be performed three or more times. Accordingly, the sequence controlling circuitry 120 may execute the pulse sequence three or more times.

Further, for instance, the example was explained in which, during the preparation module 10, the image taking process is performed twice by using the TE values that cause the first and the second signals to be in-phase with each other and to have the phases opposite to each other; however, possible embodiments are not limited to this example. In the image taking process performed twice while varying the TE value, for example, the phase of the first signal and the phase of the second signal may have any relationship therebetween, as long as the phases between the two signals are in a relationship of being mutually different between the two times of the image taking process. The relationship between the phases of the two signals is not limited to being in-phase with each other and having the opposite phases to each other.

Further, the Dixon method may be applied to a center frequency for multi-slice schemes. In that situation, the center frequency may be set by using an MSOFT algorithm, for example.

Further, as the acquisition sequence 20, not only acquisition sequences based on FSE schemes, but also other various acquisition sequences may be used.

Computer Programs

Further, the instructions indicated in the processing procedures explained in the embodiments above may be executed on the basis of a computer program (hereinafter, "program") realized with software. By causing a generic computer to store the program therein in advance and to read the program, it is also possible to achieve the same advantageous effects as those achieved by the magnetic resonance imaging apparatus 100 according to any of the embodiments described above. The instructions described in the embodiments above may be recorded as a computer-executable program on a magnetic disk (a flexible disk, a hard disk, or the like), an optical disk (a Compact Disk Read-Only Memory [CD-ROM], a Compact Disc Recordable [CD-R], a Compact Disk Rewritable [CD-RW], a Digital Versatile Disk Read-Only Memory [DVD-ROM], a DVD Recordable [DVD±R], a DVD Rewritable [DVD±RW], or the like), a semiconductor memory, or a similar recording medium. As long as the storage medium is readable by a computer or an embedded system, any storage format may be used. By reading the program from such a recording medium and causing a CPU to execute the instructions written in the program on the basis of the program, the computer is able to realize the same operations as those performed by the magnetic resonance imaging apparatus 100 in any of the embodiments described above. Further, when obtaining or reading the program, the computer may obtain or read the program via a network.

Further, a part of the processes that realize any of the embodiments described above may be performed by an Operating System (OS) working in a computer or middleware (MW) such as database management software or a network, on the basis of the instructions in the program installed in a computer or an embedded system from a storage medium. Furthermore, the storage medium does not necessarily have to be a medium independent of the computer or the embedded system and may be a storage medium downloading and storing or temporarily storing therein the program transmitted via a Local Area Network (LAN), the Internet, or the like. Also, the number of storage media being used does not necessarily have to be one. The storage medium according to the embodiments includes the situation where the processes according to the embodiments are executed from two or more media. The medium or media can have any configuration.

The computer or the embedded system according to the embodiments is configured to execute the processes in the embodiments described above on the basis of the program stored in the storage medium and may be realized with any configuration that uses a single apparatus such as a personal computer, a microcomputer or the like, or a system in which a plurality of apparatuses are connected together via a network. Furthermore, the computer according to the embodiments does not necessarily have to be a personal computer, and may be an arithmetic processing device or a microcomputer included in an information processing device, or the like. The term "computer" is a generic term for any of various devices and apparatuses that are each able to realize the functions described in the embodiments by using the program.

According to at least one aspect of the embodiments described above, it is possible to extract the signals of the fats.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
sequence controlling circuitry configured to perform a first acquisition and a second acquisition, the first acquisition including executing a preparation module corresponding to a first Echo Time (TE) value and subsequently performing an acquisition sequence, the second acquisition including executing the preparation module corresponding to a second TE value different from the first TE value and subsequently performing the acquisition sequence, the acquisition sequence being a pulse sequence including applying an RF excitation pulse in presence of a gradient magnetic field, and subsequently applying an RF re-focusing pulse in presence of another gradient magnetic field having an opposite polarity to that of the gradient magnetic field; and
processing circuitry configured to extract at least one of a signal related to a first fat and a signal related to a second fat, on a basis of data obtained from the first acquisition and data obtained from the second acquisition, wherein
a center frequency in the preparation module is a frequency corresponding to a chemical shift of the first fat,
the first TE value is a TE value that causes a signal of the first fat and a signal of the second fat to be acquired while being in-phase to each other, and
the second TE value is a TE value that causes the signal of the first fat and the signal of the second fat to be acquired while having phases opposite to each other.

2. The magnetic resonance imaging apparatus according to claim 1, wherein the sequence controlling circuitry executes the first acquisition and the second acquisition as one linked acquisition while maintaining a receiver gain at a same level.

3. The magnetic resonance imaging apparatus according to claim 1, wherein the acquisition sequence is an acquisition sequence to select a signal having a frequency corresponding to a chemical shift of the first fat.

4. The magnetic resonance imaging apparatus according to claim 1, wherein the acquisition sequence is an acquisition sequence to select at least one from between a signal having a frequency corresponding to a chemical shift of the second fat and a signal having a frequency corresponding to a chemical shift of water.

5. The magnetic resonance imaging apparatus according to claim 1, wherein the preparation module is a Dixon-type preparation module.

6. The magnetic resonance imaging apparatus according to claim 1, wherein the acquisition sequence is an acquisition sequence implemented by using a Polarity Altered Spectral and Spatial Selective Acquisition (PASTA).

7. The magnetic resonance imaging apparatus according to claim 1, wherein
the processing circuitry further receives, from a user, an input indicating types of the first fat and the second fat and establishes a setting related to the first acquisition and the second acquisition on a basis of a result of the received input, and
the sequence controlling circuitry performs the first acquisition and the second acquisition while maintaining a receiver gain at a same level.

8. The magnetic resonance imaging apparatus according to claim 1, wherein the sequence controlling circuitry performs the first acquisition and the second acquisition by further combining a Fluid Attenuated IR (FLAIR) method therewith.

9. A magnetic resonance imaging apparatus comprising:
sequence controlling circuitry configured to perform a first acquisition and a second acquisition, the first acquisition including executing a preparation module corresponding to a first Echo Time (TE) value and subsequently performing an acquisition sequence, the second acquisition including executing the preparation module corresponding to a second TE value different from the first TE value and subsequently performing the acquisition sequence, the acquisition sequence being a pulse sequence including applying an RF excitation pulse in presence of a gradient magnetic field, and subsequently applying an RF re-focusing pulse in presence of another gradient magnetic field having an opposite polarity to that of the gradient magnetic field; and processing circuitry configured to extract at least one of a signal related to a first fat and a signal related to a second fat, on a basis of data obtained from the first acquisition and data obtained from the second acquisition, wherein a center frequency in the preparation module is a frequency corresponding to a chemical shift of water, the first TE value is a TE value that causes a signal of the water and a signal of the first fat to be acquired while being in-phase with each other, and the second TE value is a TE value that causes the signal of the water and the signal of the first fat to be acquired while having phases opposite to each other.

10. The magnetic resonance imaging apparatus according to claim 9, wherein the acquisition sequence is an acquisition sequence to select at least one from between a signal having a frequency corresponding to a chemical shift of the second fat and a signal having a frequency corresponding to a chemical shift of the water.

11. The magnetic resonance imaging apparatus according to claim 9, wherein the sequence controlling circuitry executes the first acquisition and the second acquisition as one linked acquisition while maintaining a receiver gain at a same level.

12. The magnetic resonance imaging apparatus according to claim 9, wherein the acquisition sequence is an acquisition sequence implemented by using a Polarity Altered Spectral and Spatial Selective Acquisition (PASTA).

13. A magnetic resonance imaging method to be implemented by a magnetic resonance imaging apparatus, comprising:

performing a first acquisition, the first acquisition including executing a preparation module corresponding to a first Echo Time (TE) value and subsequently performing an acquisition sequence, the acquisition sequence being a pulse sequence including applying an RF excitation pulse in presence of a gradient magnetic field, and subsequently applying an RF re-focusing pulse in presence of another gradient magnetic field having an opposite polarity to that of the gradient magnetic field;

performing a second acquisition, the second acquisition including executing the preparation module corresponding to a second TE value different from the first TE value and subsequently performing the acquisition sequence; and extracting a signal related to a first fat and a signal related to a second fat, on a basis of data obtained from the first acquisition and data obtained from the second acquisition, wherein a center frequency in the preparation module is a frequency corresponding to a chemical shift of the first fat, the first TE value is a TE value that causes a signal of the first fat and a signal of the second fat to be acquired while being in-phase to each other, and the second TE value is a TE value that causes the signal of the first fat and the signal of the second fat to be acquired while having phases opposite to each other.

14. The magnetic resonance imaging method according to claim 13, comprising executing the first acquisition and the second acquisition as one linked acquisition while maintaining a receiver gain at a same level.

15. The magnetic resonance imaging method according to claim 13, wherein performing the acquisition sequence comprises selecting a signal having a frequency corresponding to a chemical shift of the first fat.

16. The magnetic resonance imaging method according to claim 13, wherein performing the acquisition sequence comprises selecting at least one from between a signal having a frequency corresponding to a chemical shift of the second fat and a signal having a frequency corresponding to a chemical shift of water.

17. The magnetic resonance imaging method according to claim 13, wherein the preparation module is a Dixon-type preparation module.

18. The magnetic resonance imaging method according to claim 13, wherein the acquisition sequence is implemented by using a Polarity Altered Spectral and Spatial Selective Acquisition (PASTA).

19. The magnetic resonance imaging method according to claim 13, comprising:

receiving, from a user, an input indicating types of the first fat and the second fat and establishing a setting related to the first acquisition and the second acquisition on a basis of a result of the received input, and performing the first acquisition and the second acquisition while maintaining a receiver gain at a same level.

20. The magnetic resonance imaging method according to claim 13, comprising performing the first acquisition and the second acquisition by further combining a Fluid Attenuated IR (FLAIR) method therewith.

* * * * *